(12) United States Patent  
Ter Meulen et al.

(10) Patent No.: US 11,977,328 B2  
(45) Date of Patent: May 7, 2024

(54) FLEXIBLE STAMP WITH TUNABLE HIGH DIMENSIONAL STABILITY

(71) Applicant: MORPHOTONICS HOLDING B.V., Veldhoven (NL)

(72) Inventors: Jan Matthijs Ter Meulen, Eindhoven (NL); Bram Johannes Titulaer, Veldhoven (NL); Adrianus Van Erven, Casteren (NL); Leon Willem Veldhuizen, Utrecht (NL)

(73) Assignee: MORPHOTONICS HOLDING B.V., Veldhoven (NL)

( * ) Notice: Subject to any disclaimer, the term of this patent is extended or adjusted under 35 U.S.C. 154(b) by 112 days.

(21) Appl. No.: 17/283,505

(22) PCT Filed: Oct. 11, 2019

(86) PCT No.: PCT/EP2019/077606  
§ 371 (c)(1),  
(2) Date: Apr. 7, 2021

(87) PCT Pub. No.: WO2020/074709  
PCT Pub. Date: Apr. 16, 2020

(65) Prior Publication Data  
US 2021/0397083 A1    Dec. 23, 2021

(30) Foreign Application Priority Data  
Oct. 12, 2018    (EP) .................................... 18200147

(51) Int. Cl.  
*G03F 7/00*    (2006.01)

(52) U.S. Cl.  
CPC .................................. *G03F 7/0002* (2013.01)

(58) Field of Classification Search  
CPC ....... G03F 7/0002; B29C 59/02; B32B 27/08; B32B 2307/734  
See application file for complete search history.

(56) References Cited

U.S. PATENT DOCUMENTS

| 2005/0238967 A1 | 10/2005 | Rogers et al. |
| 2010/0018420 A1 | 1/2010 | Menard |

(Continued)

FOREIGN PATENT DOCUMENTS

| CN | 1960855 A | 5/2007 |
| CN | 101427182 A | 5/2009 |

(Continued)

OTHER PUBLICATIONS

JP2004303654A, Organic Electroluminescent Element and Its Manufacturing Method, Machine Translation, Oct. 28, 2004 (Year: 2004).*

(Continued)

*Primary Examiner* — Alison L Hindenlang  
*Assistant Examiner* — Erica Hartsell Funk  
(74) *Attorney, Agent, or Firm* — Merchant & Gould P.C.

(57) ABSTRACT

A flexible stamp comprising at least three layers, an upper layer as a texturing layer (203) having a relief area (203B), a strengthening layer (202) and a protective layer (201), characterized in that the strengthening layer (202) has a thermal expansion coefficient of 10 ppm/° C. or lower, a Young's modulus in the range of 10 GPa-200 GPa, a layer thickness of below 300 μm and an area which at least covers the relief area (203B).

13 Claims, 6 Drawing Sheets

(56) References Cited

U.S. PATENT DOCUMENTS

Figure 1:
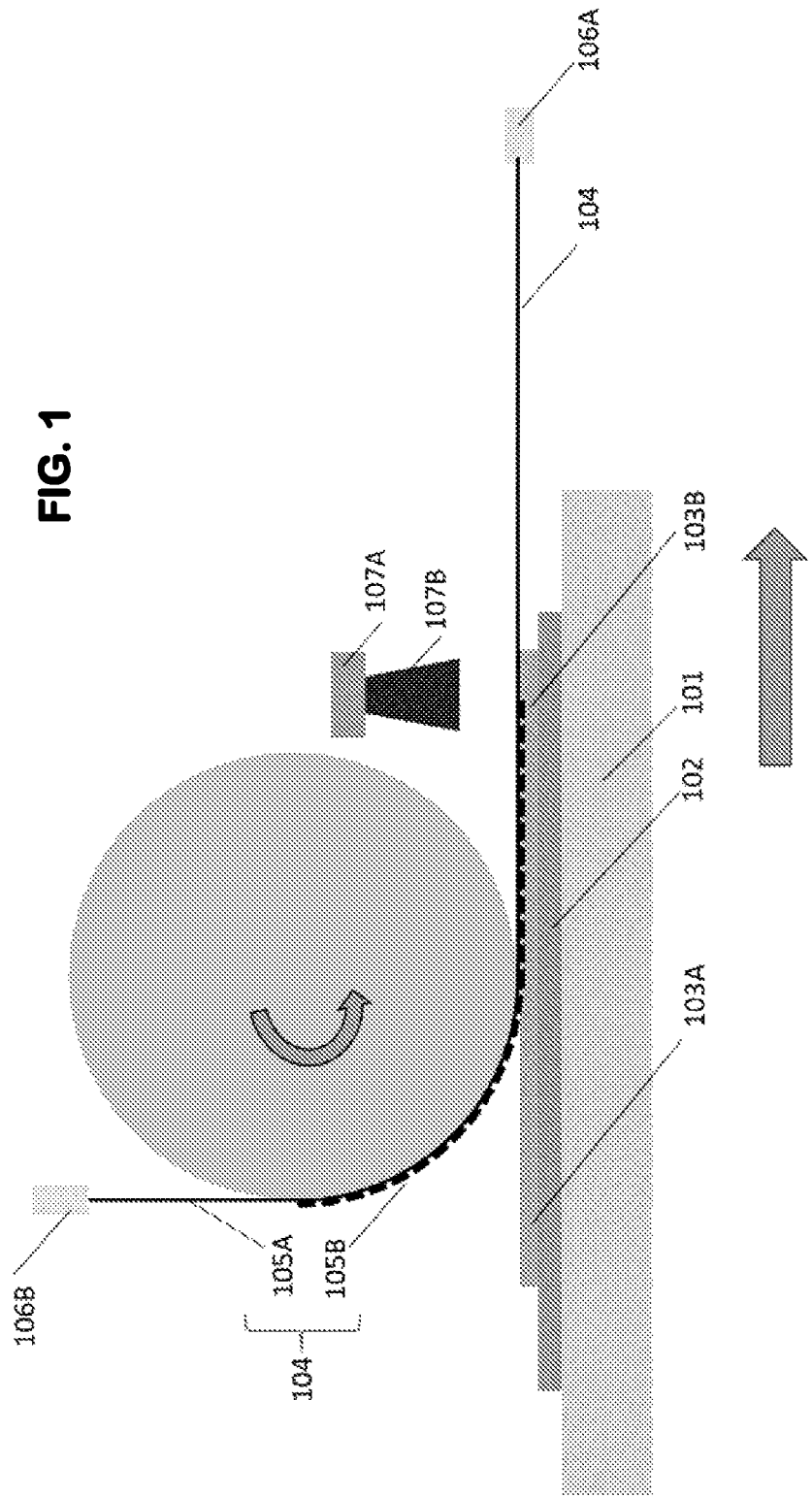

2014/0305500 A1 10/2014 Zhu et al.
2017/0203471 A1 7/2017 Obata et al.

FOREIGN PATENT DOCUMENTS

| CN | 104303104 | A | | 1/2014 | |
|----|-----------|---|---|--------|---|
| CN | 106462054 | A | * | 2/2017 | ............... G03F 7/00 |
| CN | 108475621 | A | | 8/2018 | |
| EP | 2476538 | A2 | | 7/2012 | |
| EP | 3370250 | A1 | | 9/2018 | |
| JP | 2004303654 | A | * | 10/2004 | ............. H01L 51/50 |
| JP | 2017084900 | A | | 5/2017 | |
| WO | 2018008326 | A1 | | 1/2018 | |

OTHER PUBLICATIONS

CN106462054A, Imprinting method, computer program product and apparatus for the same, Machine Translation, Feb. 22, 2017 (Year: 2017).*
M. Lindqvist, Edge-Strengthening of Structural Glass with Protective Coatings, Key Engineering Materials vols. 488-489 (2012) pp. 331-334 (Year: 2012).*
J.W. Martin, 4—Glasses and ceramics, Editor(s): J.W. Martin, Materials for Engineering (Third Edition) (Year: 2006).*
Hongbo, Lan; "Soft UV Nanoimprint Lithography and Its Applications" In: "Updates in Advanced Lithography", Jul. 3, 2013, InTech, pp. 6-8.
Chinese Office Action received for CN Application No. 201980066409.4 on Dec. 25, 2023, 15 pgs.

* cited by examiner

FLEXIBLE STAMP WITH TUNABLE HIGH DIMENSIONAL STABILITY

The present invention pertains to a process and to a material for texturing discrete substrates such as displays, lighting or solar panels, by imprinting an imprinting lacquer with a dimensionally stable flexible stamp onto a discrete substrate, followed by curing of the imprinted lacquer, resulting in an additional functional textured layer on the discrete substrate. The function of this additional layer can amongst others vary from a light management layer to a hydrophobic layer, decorative use, use in biosensors or use as an etch resist.

The use of functional textured layers on substrates is an important topic. The smart usage of such layers can enhance performance, reduce cost or improve the visual appearance of a product comprising said imprinted substrate. For example, diffusing layers are used in displays, enabling the use of thinner LED backlight concepts and illuminating the display from the sides. Other new high-tech possibilities are the integration of functional textured layers into solar panels improving their efficiency or integration in organic light-emitting diode (OLED) lighting panels to extract more light.

Functional textured layers can be made by use of imprint lithography. In this case the substrate, or mold, or both are coated with a lacquer (resin or resist). After pressing the mold on the substrate with lacquer in between, the textured lacquer is cured to a solid phase. The curing method can be thermal or UV light irradiation. Already in 1978, this technology was mentioned in U.S. Pat. No. 4,128,369. Further pioneer work was done by Chou in 1995. He demonstrated that by use of a rigid stamp sub-25 nm textures could be replicated in high throughput mass production (U.S. Pat. No. 5,772,905) or in an article by Stephen Y. Chou, Peter R. Krauss, Preston J. Renstrom (Appl. Phys. Lett. 67 (1995) 3114-3116). Later-on the use of a roller to apply pressure on either a rigid mold or a bent thin metal sheet to replicate textures was demonstrated (article Hua Tan, Andrew Gilbertson, Stephen Y. Chou, J. Vac. Sci. Technol., B 16 (1998) 3926-3928).

Many institutes and companies continued this work, resulting in different techniques.

In the semiconductor industry plate-to-plate imprinting is applied by using a rigid stamp in combination with a transfer process, materials and precise positioning as described in U.S. Pat. No. 6,334,960, US Patent Application 2004/0065976 and U.S. Pat. No. 8,432,548.

The roll-to-roll imprinting technique uses textured rollers in combination with flexible substrates to texture foils or films in a continuous process as described in e.g. the U.S. Pat. No. 8,027,086.

The first mentioned plate-to-plate technique is designed for the precise, wafer-scale imprinting of small textures (resolution in sub-100 nm) on uniform flat wafers with high position accuracy. But as described in the Chinese Patent Application CN 103235483, this technology is difficult to scale to larger areas.

By use of the roll-to-roll technology textured foils can be made continuously at high production speeds. These foils can be used as substrates for flexible applications or can be laminated to rigid substrates. However, the latter comes at additional costs of an intermediate adhesive layer to adhere the textured foil to the rigid substrate or product. Therefore, a third new technology is being developed: direct roll-to-plate imprinting. Hereby the functional textured layer is directly applied on the discrete substrate without intermediate thick adhesive layers of tens to hundreds of microns in thickness. In such processes either a textured roller, as exemplified in the French Patent 2,893,610 or a removable flexible stamp is used, as disclosed in U.S. Pat. No. 7,824,516.

The use of a flexible stamp in the roll-to-plate replication process has several advantages. The materials and manufacturing process are cost effective. Moreover, the flexible stamp can be easily exchanged. There are also disadvantages of the use of a flexible stamp. Most important disadvantage is that polymer-based flexible stamps have limited lateral dimensional stability. The flexible stamp will expand or shrink if the temperature, humidity or tension changes within the equipment or during processing. For most applications the flexible stamp has an expansion coefficient that differs from the used substrate. The substrate is in most cases a discrete and rigid metal, polymer, silicon or glass plate. Varying temperatures or humidity levels will therefore result in different lateral dimensions of the imprinted texture on the substrate after the imprinting process. In this case either the optical properties will shift, or the texture will be placed at the wrong position relative to the underlying structures or patterns applied in post-processing steps. For many applications only a very limited lateral dimension variation is tolerated like of a few microns over 1 meter.

Because the effect of a varying lateral dimension is prominent with a varying temperature, this invention focuses on thermal expansion. A varying humidity has similar effects. And also strain or tension will deform the flexible stamp. In the context of this description, where thermal expansion is mentioned, also humidity expansion or expansion by tension can be read. Where expansion is mentioned also shrinkage can be read as a form of negative expansion.

In patent application WO 2016/128494 the design of a flexible stamp has been described. Hereby the flexible stamp contains a stamp base or base layer and a textured layer on top. The flexible stamp can be one layer or multiple layers, having a base layer and textured top layer. For the base layer several materials have been mentioned, including plastic foils and thin metal sheets.

The document US 2005/0238967 A1 discloses a composite patterning device for soft lithography, wherein the composite patterning device comprises a plurality of polymer layers.

A straightforward solution to improve the dimensional stability of a flexible stamp is to use materials with a very low thermal expansion as a base layer. This can be the use of a flexible reinforced polycarbonate as base layer. Still the thermal expansion coefficient of these strengthened materials is large, above 10 ppm/° C.

In the patent application WO 2016/128494 the usage of a metal sheet has been mentioned. In patent application KR 2008/0044052 the usage of a glass sheet as mold has been discussed for plate-to-plate applications. However, thick glass sheets and metal sheets are rigid, which have two major disadvantages: First, the sheets cannot be guided over rollers which is a requirement for a flexible stamp to be used in a roll-to-roll or roll-to-plate imprint process. Second, the delamination of a rigid stamp needs higher forces.

For roll-to-plate imprinting a large degree of flexibility is required as the stamp is transported over rollers. Thin metal is flexible enough, but is not transparent, which makes UV curing through a metal flexible stamp impossible.

Glass above 300 µm thickness is not flexible enough and will break when bent at the required radii. Glass below 300 µm in thickness might be flexible enough, but is very prone to breakage. Even very small forces, especially on the edges of the glass, result in cracks. Additional layers applied to the glass, will deteriorate the dimensional stability of the glass sheets and are therefore not preferred. Therefore, the straightforward solution cannot be used in roll-to-plate imprinting.

In application WO 2016/12849 it is mentioned that more layers can be added to enhance robustness. The method how this should be done is not disclosed.

In EP-A-3028771 it is mentioned that to obtain precise overlay alignment between the stamp and the substrate, the stamp should have the same expansion coefficient as the substrate on which the texture is replicated. As an example, said patent application discusses the replication of micro- or nano textures on a steel substrate by use of a flexible plate-to-plate stamp with steel protective layer. The stamp is called a flexible stamp because the texturing layer is flexible. The purpose is for use in a plate-to-plate replication process. The steel stamp cannot be transported over rollers and thereby the proposed solution cannot be used in a roll-to-plate process. The patent application does show the importance of having stamps with different expansion coefficients for different applications.

EP-A-3370250 discloses a film mold, which can have a three-layered structure comprising a first resin layer, a first glass substrate layer and a second resin layer. The second resin layer could be a resin or a foil, or a foil added to the glass with an adhesive layer. However, in practice the glass substrate layer tends to break or to get cracks after multiple use.

The problem underlying the present invention is to provide a dimensionally stable flexible stamp, in particular to enable roll-to-plate imprinting of discrete substrates with a low and tunable thermal expansion coefficient of below 20 ppm/° C., which can be used multiple times wherein the glass layer does not provide crack or breaks. Breakage of the flexible stamp limits the reuse of the flexible stamp. The design of a more robust flexible stamp with low and tunable expansion coefficient is therefore important to enable the re-use of the flexible stamp and lower the manufacturing costs.

This problem is solved by a flexible stamp comprising at least an upper layer as a texturing layer (203) and comprising a relief area (203B), a strengthening layer (202), a protective layer (201), wherein the strengthening layer (202) has a thermal expansion coefficient of 10 ppm/° C. or lower, a Young's modulus in the range of 10 GPa-200 GPa, a layer thickness of below 300 µm and an area which at least covers the relief area (203B), characterized in that the strengthening layer is shielded by at least one layer selected from a group consisting of the texturing layer (203), the protective layer (201) and one or more further layers.

Said at least three- or multilayered strengthened flexible stamp enables imprinting of discrete substrates at a minimal change in lateral dimension often caused by thermal and humidity changes and changes in tension. The said multilayered stamp can be manufactured having large areas compared to standard wafer sizes with a diameter of 300 mm. Said thermal expansion of the multilayer strengthened flexible stamp is significantly lower than the current standard flexible stamp expansion coefficients. Standard polycarbonate has a thermal expansion coefficient of 65 to 70 ppm/° C. Strengthened flexible foils as for instance reinforced polyethyleneterephthalate (PET) do have a minimum thermal expansion of 20 ppm/° C. The thermal expansion coefficient can be measured according to ASTM E228.

| | Thermal expansion coefficient (ppm/° C.) | Reference |
| --- | --- | --- |
| Thin glass sheet | 3-3.5 | Corning |
| Nickel sheet | 13 | Polytechnisch zakboek, Leijendeckers |
| Molybdenum sheet | 4.5 | Polytechnisch zakboek, Leijendeckers |
| Chromium sheet | 7 | Polytechnisch zakboek, Leijendeckers |
| Tungsten sheet | 5 | Polytechnisch zakboek, Leijendeckers |
| Polycarbonate foil | 65-70 | https://www.engineeringtoolbox.com/linear-expansion-coefficients-d_95.html |
| Reinforced PET foil | >20 | http://www.goodfellow.com/E/Polyethylene-terephthalate.html |
| Multilayered strengthened flexible stamp | 5-15 | Own measurements |

Further, the strengthening layer of the flexible stamp has a Young's modulus in the range of 10 to 200 GPa measured according to ASTM E111.

The multilayer strengthened flexible stamp provided in the current invention comprises three or more layers bonded to one another. The multilayer strengthened flexible stamp may thus have a texturing layer having a relief area, one or more strengthening layers with a lower thermal expansion coefficient as the texturing layer and one or more protective layers with higher thermal expansion coefficient than the strengthening layer. Hereby the strengthening layer has an area which at least covers the relief area.

Within the scope of the invention, the term "shielding" has to be understood that the strengthening layer is e.g. protected against an object or a force, which can harm the strengthening layer. In the flexible stamp the strengthening layer is shielded by at least one layer, which extends at least partially around or over the edge and/or corner portions of the strengthening layer. If one or more of the layers selected from the group consisting of the texturing layer (203), the protective layer (201) and one or more further layers at least extends partially over or around the edge and/or corner portions of the strengthening layer this or these layer(s) is the "shielding layer".

The strengthening layer can be a three-dimensional layer comprising a first main surface, a second main surface and at least one side surface which is perpendicular to the first main surface and the second main surface and is the limitation of the extension of the first main surface and the second main surface of the strengthening layer. Thereby, the strengthening layer can have any suitable form such as rectangular, trapezoidal, circular or oval. Preferably, the strengthening layer has a rectangular form such that the strengthening layer comprises a first main surface, a second main surface and four sides surfaces which are perpendicular to the first main surface and to the second main surface.

The first main surface and the second main surface can be parallel to each other and facing opposite directions. Preferably, the first main surface is facing the relief area and the second main surface is not facing the relief area.

In a preferred embodiment, for shielding at least partially the corner and/or the edge portions of the strengthening layer by at least one layer selected from a group consisting of the texturing layer, the protective layer or one or more further layers, the at least one layer extends at least partially around the edge and/or corner portions of the strengthening layer.

In a further preferred embodiment, the at least one layer shields the at least one side surface and the first main surface and/or the second main surface of the strengthening layer.

Preferably, the at least one layer shields the at least one side surface and the first main surface and the second main surface.

In a preferred embodiment, at least one corner portion, preferably at least two corner portions, more preferably at least three corner portions, even more preferably at least four corner portions, and most preferably all corner portions of the strengthening layer are shielded at least partially by the at least one layer.

In further preferred embodiment, at least one edge portion, preferably at least two edge portions, more preferably at least three edge portions, even more preferably at least four edge portions, and most preferably all edge portions of the strengthening layer are shielded at least partially by the at least one layer.

It is also possible that the number of shielded corner portions and edge portions are the same or different. Preferably, all corner portions and edge portions of the strengthening layer are shielded at least partially.

By shielding at least partially the corner and/or the edge portions of the strengthening layer, it is believed that the proneness to break of the strengthening layer is eliminated or at least reduced, such that the strengthened flexible stamp is able to be used multiple times.

In a preferred embodiment, the at least one layer shielding the corner and/or edge portions of the strengthening layers shields at least partially the first main surface and the second main surface. Preferably, the at least one layers shielding at least partially the first main surface and the at least one layer shielding at least partially the second main surface are separate layers.

In another preferred embodiment, the at least one layer shielding the corner and/or edge portions of the strengthening layers encompasses the corner and/or edge portions of the strengthening layer.

In a preferred embodiment, the at least one layer shielding the corner and/or edge portions of the strengthening layer extends over at least 10%, preferably at least 30%, even more preferably at least 50%, even more preferably at least 75%, and most preferably at least 95% of an area of the first main surface.

In another preferred embodiment, the at least one layer shielding at least partially the corner and/or edge portions of the strengthening layer extends over at least 10%, preferably at least 30%, even more preferably at least 50%, even more preferably at least 75%, and most preferably at least 95% of an area of the second main surface.

Preferably, the at least one layer shielding at least partially the corner and/or edge portions of the strengthening layers encompasses the strengthening layer.

The at least one layer can be made of any suitable material, preferably the one or more further layers is an adhesion layer comprising a material selected from a group consisting of a glue, a pressure sensitive adhesive, a cured organic layer as for instance but not limited to an acrylate material, a sol-gel material, an epoxy or a combination thereof.

Preferably, the at least one layer is the texturing layer, the protective layer, a glue layer or a combination thereof.

In another preferred embodiment, the flexible stamp comprises a further protective layer on the side of the strengthening layer which is opposite to the side facing the texturing layer respectively the relief area, wherein the extension of the further protective layer are smaller than the extension of the strengthening layer. It is also preferred that the extension of the further protective layer is larger than the extension of the texturing layer.

This further protective layer can act as a dimensional stability tuning layer, which can tune the dimensional stability of the area on which the relief area is located.

In a further embodiment, the flexible stamp comprises one or more additional strengthening layers.

Figure 2:
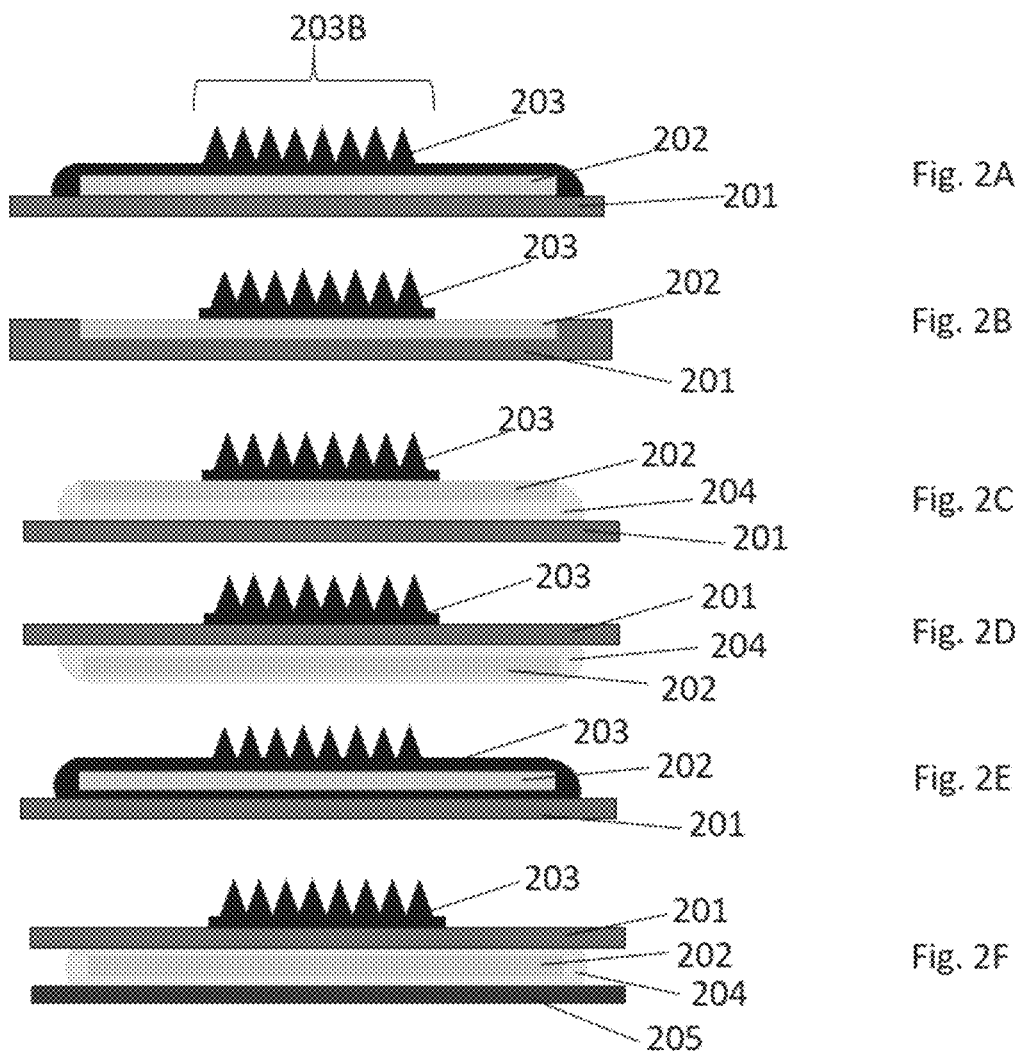
Figure 3:
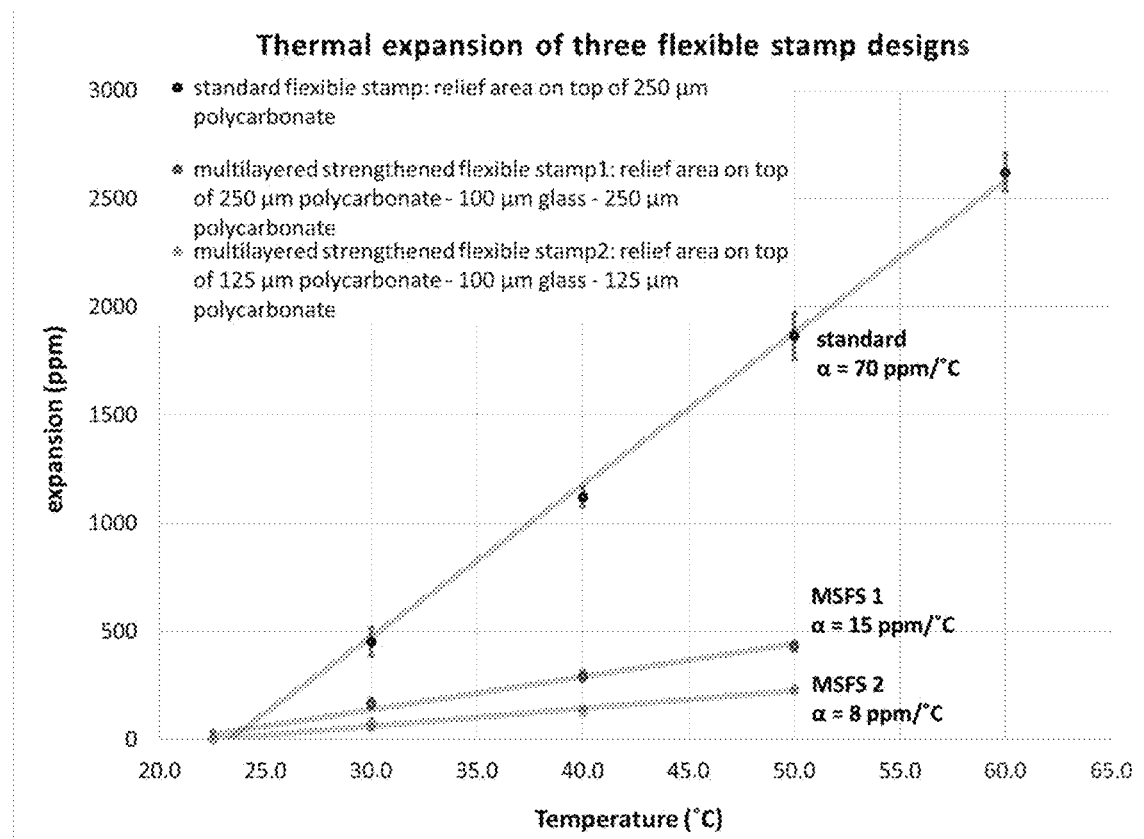
Figure 4A:
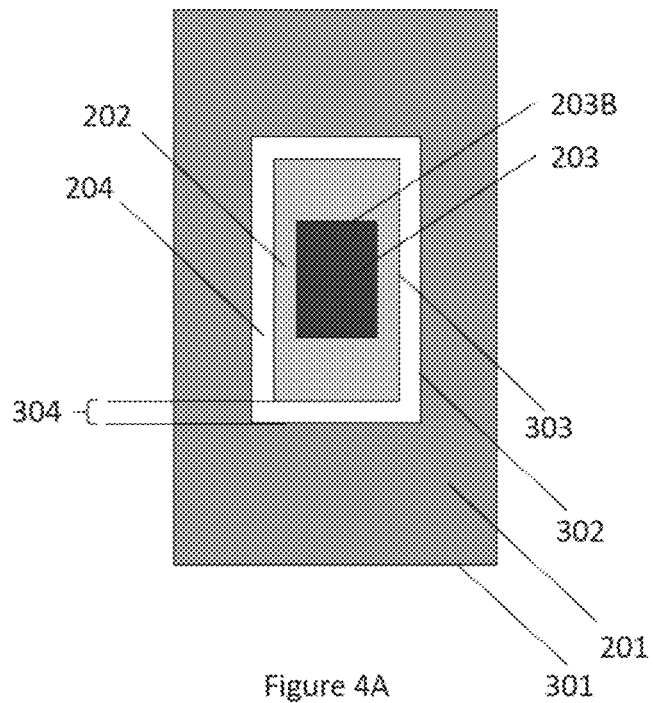
Figure 4B:
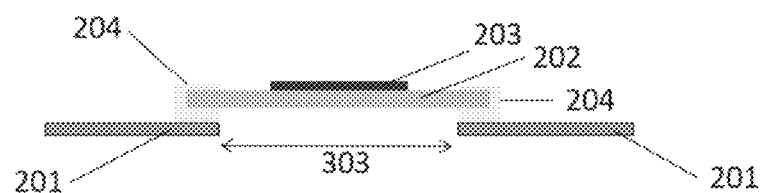
Figure 4C:
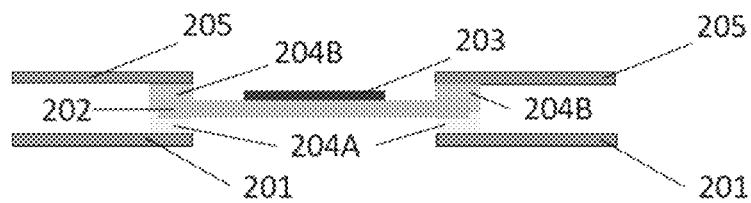
Figure 4D:
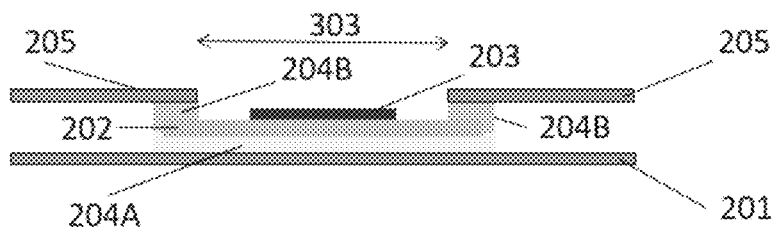
Figure 5:
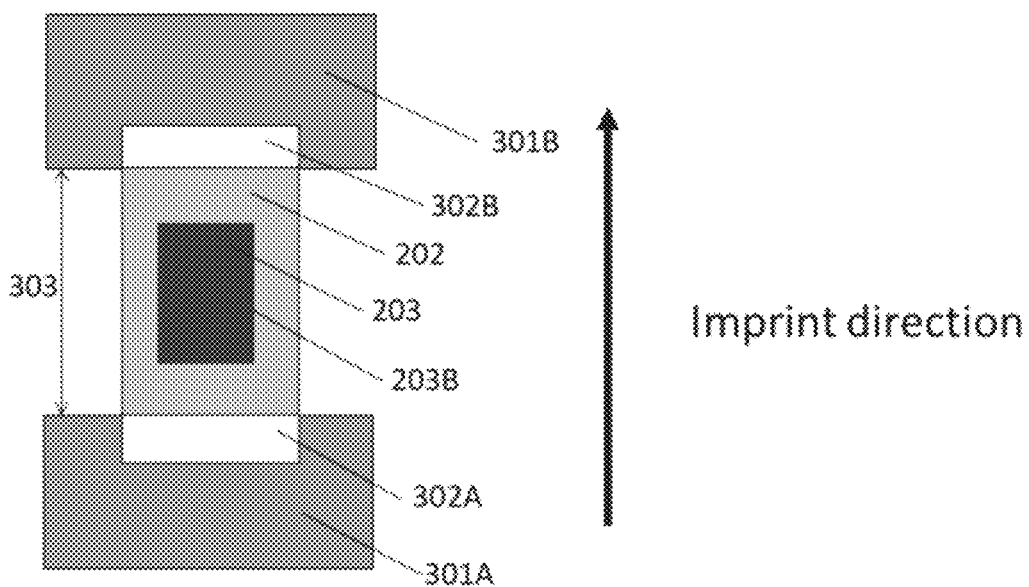
Figure 6A:
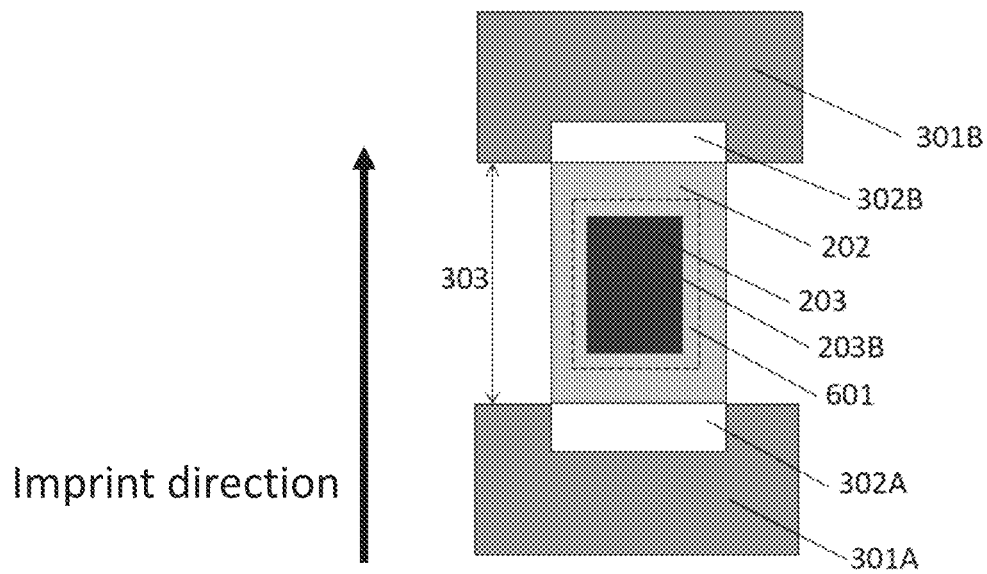
Figure 6B:
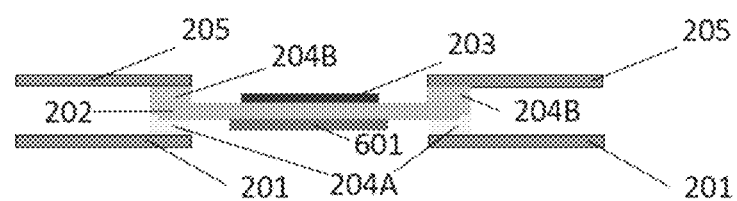

The invention is being explained now in more detail with reference to the following Figures:

FIG. 1 schematically depicts an illustrative imprinting process according to the present invention FIG. 2 schematically depicts different layouts of a multilayered strengthened flexible stamp with a strengthening layer and a protective layer from a side view FIG. 3 shows the thermal expansion measurement results for different flexible stamp layouts, including two multilayered strengthened flexible stamp designs FIG. 4 schematically depicts a multilayered strengthened flexible stamp with protective layer at the 4 outer areas of the strengthening layer from a top and side view FIG. 5 schematically depicts a multilayered strengthened flexible stamp with protective layer at 2 outer areas of the strengthening layer from a top view FIG. 6A schematically depicts a multilayered strengthened flexible stamp with a protective layer at the side of the strengthening layer which is opposite to the side facing the texturing layer, and FIG. 6B shows a schematic cross section through the textured area of the strengthened flexible stamp with the protective area of 6A.

Referring now to FIG. 1, a schematic imprint equipment and process according to the present invention is illustrated with use of the multilayered strengthened flexible stamp. FIG. 1 is an example of possible use of the multilayered strengthened flexible stamp in an exemplary roll-to-plate imprint process. Note that the multilayered strengthened flexible stamp can be used in different roll-to-plate and roll-to-roll replication processes, or even in a plate-to-plate replication process.

In the imprint set-up shown in FIG. 1 the functional imprint layer 103B will be applied on top of the substrate 102. The substrate 102 can be any material; preferably the substrate 102 comprises or is made of glass, metal sheets, polycarbonate (PC), polyethylenenaphthalate (PEN), polyethyleneterephthalate (PET or PETP), biaxial oriented polyethylene terephthalate (BOPET) or polymethylmethacrylate (PMMA). The substrate 102 may carry one or more additional layer(s) coated on top of the surface like for instance an adhesion promotion layer and/or a transparent conductor layer (e.g. indium tin oxide, aluminum doped zinc-oxide or flourine doped tin oxide) and/or a metal layer (e.g. silver, gold, aluminum). In FIG. 1 the substrate 102 is coated with a formable imprint lacquer 103A and imprinted with the flexible stamp 104, which after curing results in a replicated imprint texture 103B which is added on top of substrate 102. The substrate is placed on platform 101 for guidance and support. This platform 101 can be one or multiple rollers, a fixed table, moving table or any other platform providing sufficient support. In FIG. 1 the mold is a flexible stamp 104. To transfer the texture 105B on the outer surface of the flexible stamp 104 onto the substrate 102, the imprint texture 105B, having the inverse texture of the required solidified imprint texture 103B on the substrate 102, is pressed on the discrete substrate 102 with the formable imprint lacquer 103A in between. Note that the formable lacquer 103A can be deposited on the discrete substrate as shown in FIG. 1, or the formable imprint lacquer can be deposited on the flexible stamp 104. Or the formable imprint lacquer 103A can be deposited both on the flexible stamp 104 and on the discrete substrate 102. The method of deposition can, amongst others, be dispensing, ink-jet printing, slot-dye coating, gravure printing, or screen-printing. After imprinting the formable imprint lacquer 103A with use of the flexible stamp 104, the formable imprint lacquer 103A is solidified either thermally or by use of UV light. In FIG. 1 the formable lacquer is solidified by use of the UV light 107B from the UV light source 107A. The UV light source 107A can be placed above the transparent flexible stamp 104. Or in case the discrete substrate 102 is transparent, the UV light source 107A can be placed underneath of the transparent discrete substrate 102 either integrated in the platform 101 or underneath of a transparent platform 101. After solidifying of the imprint texture 103B, the flexible stamp 104 is separated from the solidified imprint texture 103B on discrete substrate 102 such that the discrete substrate 102 with solidified imprint texture 103B thereon is spaced apart from the template in the form of the flexible stamp 104. The flexible stamp 104 is mounted in the front clamp 106A and in the back clamp 106B. The front clamp 106A is positioned at the onset of the flexible stamp 104. The back clamp 106B is positioned at the end of the flexible stamp 104. The clamp 106A and/or the clamp 106B can be a plastic or metal bar, possibly with a mounting opening. But the clamp 106A and/or the clamp 106B can also be a tape or any other means to hold the flexible stamp 104 in its place.

The flexible stamp 104 has a supporting flexible stamp base 105A and a patterned outer surface 105B, also referred to as "the imprint texture" or "the imprint pattern". This imprint texture comprises a functional area which is formed by openings and elevations, which for the ones skilled in the art is known as relief pattern. This relief patterned outer surface 105B is the negative (or inverse) texture of the imprint texture 103B on the substrate 102. The flexible stamp base 105A and the patterned outer surface 105B can be made of one and the same material, as for instance—but not limited to—thin metal sheets or plastic sheets made by a milling, plating or hot embossing process. Thin metal sheets have the disadvantage of being non-transparent, less flexible and more expensive. In the case of large area roll-to-plate replication the thin metal sheets have to be large, which is practically and cost-wise challenging. In the case of plastic sheets, the thermal expansion will be determined by the expansion coefficient of the plastic sheet. As discussed for plastic based materials this is too large for precise replication applications.

The multilayered strengthened flexible stamp according to the invention is provided comprising a patterned outer surface 105B comprising openings and elevations. To be able to be bent, the strengthened flexible stamp preferably exhibits a Young's Modulus in the range from 0.1 GPa to 100 GPa, preferably between 5 and 50 GPa. Preferably, the multilayer strengthened flexible stamp of the current invention has a thickness in the range from 10 µm to 2000 µm, more preferred in the range from 50 µm to 500 µm. The specification on the layer thickness and Young's Modulus does together result in a bending radius of preferably below 30 cm, more preferred below 15 cm, at an applied force of preferably below 1000 N over a width of 50 cm. Hereby the force is defined as the force exerted on the front of the flexible stamp 106A to pull the flexible stamp around a quarter of the roller as shown in FIG. 1.

As proposed in this patent application, by use of a strengthening layer, the thermal expansion as well as the expansion of the flexible stamp due to an increase of humidity or tension can be reduced. This reduction is achieved by the features of claim 1. In FIG. 2, different layouts of the multilayered strengthened flexible stamp are shown.

FIG. 2 shows different layouts of a multilayered strengthened flexible stamp using a strengthening layer 202 in combination with texturing layer 203 and a protective layer 201. The large area flexible protective layer 201 is used to provide the flexible properties, to have easy handling. Moreover, depending on the flexible stamp configuration the protective layer 201 can protect the main surface and/or second surface and/or sides of the strengthening layer. This protective layer 201 can be for instance, but not limited to, polyethyleneterephthalate (PET or PETP) foil, polycarbonate (PC) foil, polyethylenenaphthalate (PEN) foil, biaxial oriented polyethylene terephthalate (BOPET) or foils made of another polymer. It can also be a cured acrylate material or cured epoxy material. The proposed materials for the protective layer 201 have a Young's Modulus of 0.1-10 GPa in combination with a layer thickness below 500 µm, preferably below 300 µm. A strengthening layer 202 is deposited on the protective layer 201. This can be a 0.5-100 µm thick layer, for instance but not limited to a SiOx layer or graphene layer. Deposition techniques of the strengthened layer 202 can be, amongst others, sputtering, spin-coating or PE-CVD. As strengthening layer 202 also a thin metal sheet, thin wafer or thin glass sheet can be used. This strengthening layer 202 should be flexible and have typical a Young's Modulus of 10-200 GPa in combination with a layer thickness below 300 µm, preferably below 200 µm. In the case of an intermediate thin flexible sheet, the thin sheets should be adhered to the protective layer 201. This can be adhered by use of an adhesion layer 204, which can be any mounting material, as for example a tape placed on top at the transition of both layers or in between both the protective layer 201 and strengthening layer 202 or an intermediate adhesion layer, which can be a glue, a pressure sensitive adhesive or a cured organic layer as for instance but not limited to an acrylate material, a sol-gel material, an epoxy. Thereby, the adhesion layer 204 can shield the corner and/or edge portions of the strengthening layer 202, as the adhesion layer 204 extends at least partially around the corner and/or edge portions of the strengthening layer 202. The texturing layer 203 has a relief area 203B having the inverse texture as required on the substrate. The material of the inverse texture 203 is an organic layer, as for instance but not limited to an acrylate material, a sol-gel material or an epoxy. Depending on the configuration, the texturing layer 203 protects the first main surface and/or second main surface and/or at least one side surface of the strengthening layer 202.

In FIG. 2A the strengthening layer 202 is embedded in the texturing layer 203 such that corner and/or edge portions of the strengthening layer 202 are shielded at least partially. For shielding the corner and/or edge portions of the strengthening layer 202, the strengthening layer 202 can also be embedded in the protective layer 201, as shown in FIG. 2B. The strengthening layer 202 can be positioned in between the protective layer 201 and the texturing layer 203, with relief area 203B having the inverse texture as required on the substrate. But it can also be at the other side of the protective layer 201, as shown in FIG. 2D. The adhesion layer 204 shown in FIG. 2C can be a different material as the texturing layer 203. In case of FIG. 2C and FIG. 2D the adhesion layer 204 protects the strengthening layer 202 by shielding the corner and/or edge portions of the strengthening layer 202. The adhesion layer 204 can also be the same material as the texturing layer 203, as shown in FIG. 2E. In the specific case as shown in FIG. 2E the monomeric or polymeric material of the texturing layer 203 does also work as a protective layer for the strengthening layer 202, in particular, the corner and/or edge portions of the strengthening layer 202 are shielded by the texturing layer 203 as the texturing layer 203 is encompassing the strengthening layer 202. FIG. 2F shows another flexible stamp design whereby the strengthening layer is protected between two protective layers 201 and 205. The material and/or the material thickness of both protective layers 201 and 205 can be the same or different. Also, the area of both protective layers 201 and 205 can be the same or different, whereby the shortest protective layer should minimally have the same area as the strengthening layer 202 to cover and protect the strengthening layer 202. Note that also a combination can be made between different strengthening layers 202. For instance, a thin deposited strengthening layer 202 at one side of the protective layer 201, and a second thicker strengthening layer adhered on the other side of the protective layer 201. For adhering an adhesion layer 204 is used, which encompasses the strengthening layer 202 such that the corner and/or edge portions are shielded.

The above multiple layered and strengthened flexible stamp has been reduced to practice. Flexible stamps have been made with different configurations. FIG. 3 shows the measurement data.

As is shown in FIG. 3, the thermal expansion of a standard flexible stamp with relief area (203B) on top of a polycarbonate foil is too large. The value of 70 ppm/° C. is well above the preferred maximum of 20 ppm/° C. expansion. The measured value is well in line with the theoretical value. In the case of multilayered strengthened flexible stamp1 (MSFS 1) with a relief area on top of a 250 μm protective polycarbonate layer and a 100 μm thin glass sheet as strengthening layer enclosed between the previous mentioned 250 μm protective polycarbonate layer and a second 250 μm polycarbonate protective layer, with the design as shown in FIG. 2F, the expansion is reduced to 15 ppm/° C. This expansion can be further reduced if the 100 μm thin glass sheet is enclosed between two 125 μm polycarbonate layers. In this case the expansion reduces to 8 ppm/° C. FIG. 3 shows that the expansion of multilayered strengthened flexible stamp can be tuned in the region between 5 to 20 ppm/° C. Hereby the expansion of the strengthened flexible stamp can be tuned to match with different substrate materials. The minimum bending radius has been determined for the multilayered strengthened flexible stamp2 (MSFS 2), shown in FIG. 3. A minimum bending radius of 15 mm was observed. This is lower than the 90 mm bending radius as specified by the manufacturer of the glass. In own tests a 35 mm bending radius of 100 μm bare glass was reached. This confirms that the use of a multilayered stack does protect and improve on the flexible stamp stability.

Different stamp layouts are possible, using similar materials. With the use of thin glass sheets, the outer edges & corners are most vulnerable. During the handling, transportation or use of the flexible stamp a tap on the edge can result in cracks in the glass. As a consequence, the flexible stamp cannot be used anymore. To further improve the reusability of the flexible stamp, flex stamp designs are proposed with a combination of a stable inner replication area and an outer protective area.

In FIG. 4A an example of a thermal stable replication area with outer protective area 301 is shown. In this case a protective layer 201 with protective layer area 301 is used, which has an inner opening area 303. Most likely this inner opening area 303 is a rectangle, but it can also be a circle or any other shape. The strengthening layer area 302 has a size which is larger than the inner opening area 303. Hereby a mounting overlap area 304 is created where the strengthening layer 202 with strengthening layer area 302 is mounted on top of the outer protective area 301. To mount the strengthening layer area 302 on top of the outer protective area 301 any stable adhesion layer material 204 can be used as for instance a tape or an intermediate adhesion layer, as for instance a glue, a UV-acrylate or a pressure sensitive adhesion layer. This adhesion layer 204 protects the strengthening layer 202 by shielding the side and/or corner portions of the strengthening layer 202. On top of the strengthening layer 202 the texturing layer 203, with relief area 203B, is added. Preferably the relief area 203B is fully placed within the inner opening area 303. FIG. 4B shows the schematic cross section through the textured area of the strengthened flexible stamp with outer protective area as discussed in FIG. 4A. For most safe handling the outer protective area 301 comprises two layers of protective layer 201 and protective layer 205, which are placed below and on top of the strengthening layer 202, as shown in FIG. 4C. The material and/or the material thickness of the protective layer 201 and 205 can be the same or different. Also, the adhesion layers 204A and 204B can be the same material or different mounting material. Thereby, the adhesion layers 204A and 204B are separate layers, but it is also possible that the adhesion layers 204A and 204B are one layer encompassing the corner and/or edge portions of the strengthening layer 202 (not shown). By selecting different protective layer 201 thicknesses and different protective layer 201 materials, the thermal expansion of the multilayered strengthened flexible stamp can be tuned to match the thermal expansion of the substrate. FIG. 4D shows the multilayer strengthened flexible stamp layout whereby only the protective layer 205 has an inner opening area 303. The protective layer 201 has no inner opening area 303 and does cover the strengthening layer. The adhesion layers 204A and 204B are separate layers, but it is also possible that the adhesion layers 204A and 204B are one layer encompassing the corner and/or edge portions of the strengthening layer 202 (not shown).

In FIG. 5 another layout of the strengthened flexible stamp with outer protective area 301 is shown. This FIG. 5 is a refinement of the layout shown in FIG. 4 whereby the inner opening area 303 is placed over the full width of the protective layer 202. In this case the protective layer 201 does only protect the edges and two most vulnerable sides of the strengthening layer 202. Preferably the two sides of the strengthening layer 202 which are protected by the protection layer are at the onset area 302A and end area 302B in reference to the imprint direction. The onset area 302A is most vulnerable, having first contact with the substrate within the imprint process. The inner opening area 303 has no protective layer 201. Preferably the relief area 203B is fully placed within the inner opening area 303. This results in high dimensional stability of the relief area 203. The dimensional stability of the relief area can be tuned by adding a further protective layer 601 at the side of the strengthening layer 202 which is opposite to the side facing the texturing layer respectively the relief area, as shown in FIGS. 6A and B. In this case the further protective layer 601 may have a center position similar to relief area 203, and be larger in size compared to the relief area 203. By using an additional layer with different dimensional stability within the flexible stamp stack, the dimensional stability of the total flexible stamp stack can be tuned. The width of the outer protective area 301A and 301B has minimal same width as the width of the strengthening layer area. Hereby all corners of the strengthening layer are protected. As is shown in FIGS. 4C and 4D a combination can be made with a second protective layer, which has same layout, or does fully cover the strengthening layer 202.

The invention claimed is:

1. A flexible stamp for roll-to-plate imprinting comprising at least an upper layer as a texturing layer (203) and comprising a relief area (203B), a strengthening layer (202) and at least two protective layers (201, 205), wherein the strengthening layer (202) comprises a glass layer which has a thermal expansion coefficient of 10 ppm/° C. or lower, a Young's modulus in the range of 10 GPa-200 GPa, a layer thickness of below 300 µm and an area which at least covers the relief area(203B), wherein the strengthening layer is shielded by at least two layers which extends around or over the edge and corner portions of the strengthening layer such that the strengthening layer is enveloped by the at least two layers, wherein a first layer comprises the texturing layer (203) and a first protective layer (201) and a second layer comprises a second protective layer (205).

2. A flexible stamp according to claim 1, wherein the flexible stamp has a thermal expansion coefficient of 20 ppm/° C. or lower.

3. The flexible stamp according to claim 1, wherein the flexible stamp has a bending radius of less than 30 cm.

4. The flexible stamp according to claim 1, wherein the strengthening layer (202) has thickness in the range of 0.5 µm to 300 µm.

5. The flexible stamp according to claim 1, wherein the protective layer (201) has a thickness in the range of 10 µm to 500 µm.

6. The flexible stamp according to claim 1, wherein the protective layer (201) has a Young's modulus in the range of 0.1 to 20 GPa.

7. The flexible stamp according to claim 1, wherein the flexible stamp comprises one or more additional strengthening layers (202).

8. The flexible stamp according to claim 1, wherein the material of the protective layer is selected from a group consisting of polyethylene terephthalate, polycarbonate, biaxial oriented polyethylene terephthalate, polyethylenenaphthalate, cured acrylate material and cured epoxy material.

9. The flexible stamp according to claim 8, wherein each protective layer is a foil layer.

10. A flexible stamp for roll-to-plate imprinting comprising at least an upper layer as a texturing layer (203) and comprising a relief area (203B), a strengthening layer (202), at least two protective layers (201, 205), and at least two adhesion layers (204), wherein the strengthening layer (202) comprises a glass layer which has a thermal expansion coefficient of 10 ppm/° C. or lower, a Young's modulus in the range of 10 GPa-200 GPa, a layer thickness of below 300 µm and an area which at least covers the relief area (203B), wherein the strengthening layer is shielded by at least two layers which extends around or over the edge and corner portions of the strengthening layer such that the strengthening layer is enveloped by the at least two layers, wherein a first layer comprises the texturing layer (203), a first protective layer (201) and a first adhesion layer (204) and wherein a second layer comprises a second protective layer (205) and a second adhesion layer (204).

11. The flexible stamp according to claim 10, wherein the adhesion layers comprise a material selected from a group consisting of a glue, a pressure sensitive adhesive, a cured organic layer, an acrylate material, a sol-gel material, an epoxy or a combination thereof.

12. The flexible stamp according to claim 10, wherein the material of the protective layer is selected from a group consisting of polyethylene terephthalate, polycarbonate, biaxial oriented polyethylene terephthalate, polyethylenenaphthalate, cured acrylate material, and cured epoxy material.

13. The flexible stamp according to claim 12, wherein each protective layer is a foil layer.

* * * * *